United States Patent
Okyay et al.

(10) Patent No.: US 8,072,236 B2
(45) Date of Patent: *Dec. 6, 2011

(54) DOWNLOAD SEQUENCING TECHNIQUES FOR CIRCUIT CONFIGURATION DATA

(75) Inventors: Aysel Yildiz Okyay, Istanbul (TR); Luu Ngoc Nguyen, Milpitas, CA (US); Gregory Jon Richmond, Cupertino, CA (US)

(73) Assignee: Silicon Labs Spectra, Inc., Sunnyvle, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/972,107

(22) Filed: Dec. 17, 2010

(65) Prior Publication Data

US 2011/0089971 A1    Apr. 21, 2011

Related U.S. Application Data

(63) Continuation of application No. 12/369,868, filed on Feb. 12, 2009, now Pat. No. 7,876,124.

(60) Provisional application No. 61/027,964, filed on Feb. 12, 2008.

(51) Int. Cl.
*H03K 19/173*    (2006.01)

(52) U.S. Cl. ...... 326/38; 711/167; 711/170; 365/230.09

(58) Field of Classification Search .................. None
See application file for complete search history.

(56) References Cited

U.S. PATENT DOCUMENTS

| 6,185,630 | B1 | 2/2001 | Simmons |
| 6,363,019 | B1 | 3/2002 | Erickson et al. |
| 2003/0028733 | A1 | 2/2003 | Tsunoda et al. |
| 2007/0147144 | A1 | 6/2007 | Tokiwa |

OTHER PUBLICATIONS

Declaration of Greg Richmond, Vice President of Engineering and Chief Technology Office of SpectraLinear, Inc., under 37 CFR 1.56.

*Primary Examiner* — Shawki S Ismail
*Assistant Examiner* — Jany Tran
(74) *Attorney, Agent, or Firm* — Zagorin O'Brien Graham LLP

(57) ABSTRACT

Methods, systems, and devices are described for the implementation of a novel architecture to support download sequencing techniques for circuit configuration data. Sets of configuration data from nonvolatile memory may be sequentially transferred to volatile memory to support reconfigurable circuit elements, for example, for use in a clock generator. Different programmable circuit elements may use configuration data, but have different ramp-up times before stable operation. With early download sequence positioning of configuration data, and corresponding immediacy in initiation of operation, certain clock elements are able to commence initiation of operation while remaining clock elements are provided with configuration data from a latter portion of the download sequence.

25 Claims, 8 Drawing Sheets

DOWNLOAD SEQUENCING TECHNIQUES FOR CIRCUIT CONFIGURATION DATA

This application is a continuation of U.S. patent application Ser. No. 12/369,868, entitled "DOWNLOAD SEQUENCING TECHNIQUES FOR CIRCUIT CONFIGURATION DATA", filed Feb. 12, 2009, which claims priority from U.S. Provisional Patent Application No. 61/027,964, filed Feb. 12, 2008, entitled "CONFIGURATION TECHNIQUE FOR CLOCKS", the entire disclosures of which are hereby incorporated by reference, as if set forth in full in this document, for all purposes.

BACKGROUND

Embodiments of the present invention relate to integrated circuits in general and, in particular, to download sequencing techniques for circuit configuration data. One of the success factors in the design and development of integrated circuits is the ability to adapt to new functional requirements in next generation electronic products. Traditional ways to reduce the time taken to introduce new products is to increase the available development resources and subdivide tasks to perform them in parallel. Additionally, circuits can be designed in anticipation of future requirements so that they can be reconfigured quickly. Successful reconfigurable architectures include masked ROM, gate-arrays and analog arrays where logic, memory content, or analog building block interconnects and attributes can be changed by modifying a subset of the normal process layers, typically in the metal interconnect layers.

The introduction of nonvolatile programming technology such as electrically programmable read-only memory (EPROM), electrically erasable programmable read-only memory (EEPROM), and one-time-programmable (OTP) antifuse have allowed this type of reconfiguration to be done through electrical programming rather than through wafer fabrication that requires reticle changes for implementation. When using electrical programming technology to change circuitry, it may be beneficial to have configuration information available in near "real time" fashion and at many different control or reconfiguration points within a circuit. Memory support circuits, such as data busses, address decoders, sense amplifiers, and high voltage control circuits, may be used in proximity to the respective die locations in order to support every bit used in circuit configuration. Therefore, the non-volatile memory "bit" information is sometimes stored in multiple locations throughout the semiconductor die, which may lead to an inefficient nonvolatile memory structure.

In light of the foregoing, it may be desirable to have an architecture where at least some configuration data is stored in a more centralized nonvolatile memory array and distributed upon power-up.

SUMMARY

Devices, systems, and methods are described for the implementation of a novel architecture to support download sequencing techniques for circuit configuration data. Sets of configuration data from nonvolatile memory may be sequentially transferred to volatile memory to support reconfigurable circuit elements, for example, for use in a clock generator. Different programmable circuit elements may use configuration data, but have different ramp-up times before stable operation. Novel download startup sequences are described which may lessen impact on the configuration of other clock elements. Such sequencing functionality may allow the download sequence to configure all clock elements and attain stable operation of the clock system more quickly.

For a clock generator, having selected circuit elements reach a stable operation state quickly may be desirable during power-up. Configuration data may be maintained in nonvolatile memory. Circuit elements of a clock generator may contain configurable elements programmed by data provided in volatile storage elements. During power-up, the separate nonvolatile memory may transfer configuration data to the volatile memory. Certain time keeping elements, such as a phase-lock loop, can take considerable time to reach stable operation. With early download sequence positioning of configuration data and with corresponding immediacy in initiation of operation, certain clock elements may be able to commence initiation of operation while remaining clock elements are provided with configuration data from a latter portion of the download sequence. Early download and configuration allows timekeeping elements to acquire lock in parallel with on-going download sequencing. Overall time to stable operation may be reduced with an optimal download sequence from nonvolatile memory.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
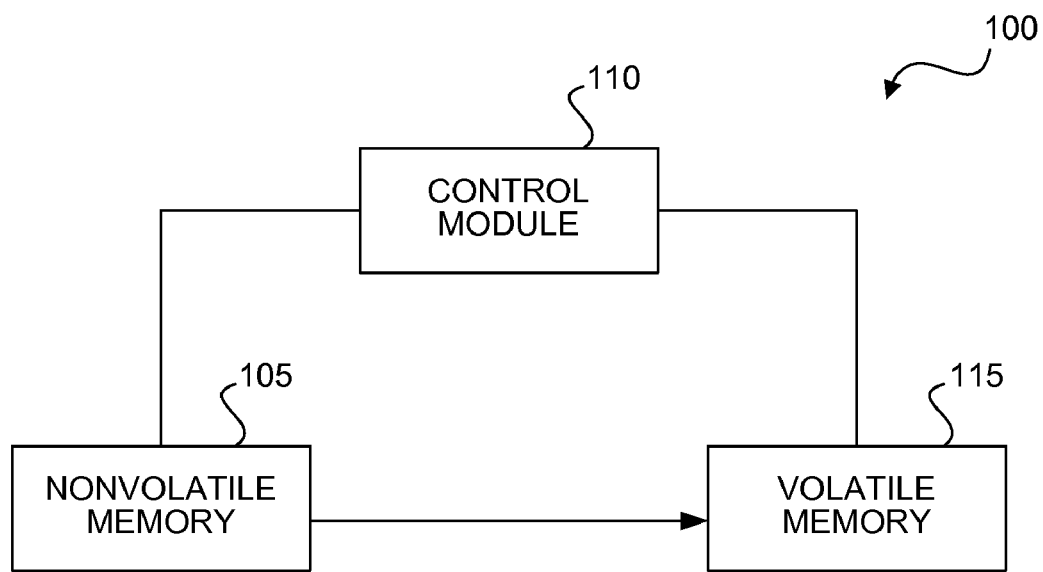
FIG. 1 is a block diagram illustrating aspects of a circuit configuration architecture configured according to various embodiments of the invention.

Systems, devices, and methods are described for the configuration of circuit elements. Techniques directed to the sequential downloading of configuration data from memory at system startup are described. Clock generators and other components are described that contain configurable circuit elements programmed by data provided in volatile storage elements. In some embodiments, during power-up, a separate nonvolatile memory may transfer configuration data to the volatile memory to initiate and control the operation of the configurable elements. Different sets of configuration data for different configurable elements may be transferred in a predetermined sequence to the volatile memory. As each set is received, operation of the relevant circuit element may be initiated according to the transferred configuration data, even as the configuration data for the remaining elements continues to be transferred in the predetermined sequence.

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add various procedures or components as appropriate. For instance, it should be appreciated that in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

In some embodiments, techniques directed to the sequential downloading configuration data from memory at system startup are described. More particularly, the invention exemplifies methods and techniques for using both nonvolatile memory arrays and volatile memory to store configuration data for a set of circuit elements. In some embodiments, these circuit elements are described for a clock generator, although many embodiments of the invention are not limited to clock generators. By way of example, some embodiments are generally directed to system initialization for a clock generator where configuration data is provided at a system start time. Configuration data is provided, such that various clock elements initiate ramp-up processes and progress toward stable operation in a predetermined sequence.

An alternative to a conventional use of nonvolatile programming technology and ensuing draw backs, as mentioned above, is to make available a dense, nonvolatile memory array within a circuit. Nonvolatile memory contents may be downloaded to volatile control registers after a sufficient voltage exists for the volatile control registers to retain the configuration data. Achieving this minimum operating voltage level is commonly referred to as circuit power-up. A clock circuit power-up time may typically be, for example, 3-10 milliseconds (ms). After circuit power-up is achieved, the download sequence from nonvolatile memory to volatile memory can begin. Once a system powers-up, it may be desirable for functionality to be achieved as soon as possible. Rather than waiting for the entire configuration information to be downloaded before enabling circuit operation, with proper ordering or sequencing of the configuration information, it is possible to download and subsequently enable portions of the circuit soon after a corresponding configuration download.

The early configured portions of the circuit may become operational and then reach a stable operating state before all or a substantial portion of the remaining configuration information is downloaded. Minimizing power-up time may be desirable for clock generators which serve as the heart of a system and must themselves become stable before the rest of the system is allowed to begin functioning. When the clock frequency is not stable when the system is enabled, errors may occur.

Referring first to FIG. 1, a block diagram is shown illustrating an example configuration 100 comprising aspects of a circuit configuration architecture according to various embodiments of the invention. This configuration 100 may be a configuration circuit, may be integrated into a clock generator architecture, or may be utilized for configuration of a number of different types of circuits. The configuration 100 includes a nonvolatile memory 105, a control module 110, and volatile memory 115, each of which may be in communication with the other.

The nonvolatile memory 105 may be an array configured to store a set of configuration data for each of a number of circuit elements. Nonvolatile memory includes memory that retains stored information even when not powered. Examples of non-volatile memory include read-only memory (ROM), electrically programmable read-only memory (EPROM), electrically erasable programmable read-only memory (EEPROM), and one-time-programmable (OTP) antifuse, and flash memory.

The control module 110, in communication with the nonvolatile memory 105 and the volatile memory 105, may be configured to control successive transfers, in a predetermined sequence, of each set of configuration data from the nonvolatile memory 105 to the volatile memory 115. In one embodiment, the control module 110 may commence the predetermined sequence with a set of configuration data corresponding to a power supply (e.g., setting a voltage level of the output of the regulator for a clock generator or other circuit). After transfer of the set of configuration data corresponding to the power supply, the control module 110 may control transfer of a second set of configuration data corresponding to a system timing circuit. Because of the sequential nature of the transfers, the operation of the power supply may be initiated upon completion of the transfer of the set of configuration data corresponding to a power supply, even as the transfer of the configuration data for the system timing circuit is ongoing.

The transfer of the set of configuration data for the system timing circuit may also occur sequentially. The transfer sequence related to the system timing circuit may begin with the transfer of a first subset of configuration data for a crystal oscillator (load capacitances), then transfer a second subset of configuration data for analog PLL parameters (e.g., programming loop filters, charge pump currents, VCO range, gain, and offset), then transfer a third subset of configuration data for digital PLL parameters (e.g., programming specific digital divider values). The operation of the crystal oscillator, analog PLL components, and digital PLL parameters may be initiated as each respective set of configuration data is received. Thus, operation may be initiated for certain system timing circuit elements (e.g., the analog PLL components) even as the transfer of the configuration data for the digital PLL parameters is ongoing.

After transfer of the set of configuration data corresponding to the system timing circuit, the control module 110 may then control transfer of a third set of configuration data corresponding to one or more system input/output (I/O) circuits. For each such I/O circuit, the configuration parameters may include, for example: I/O type (input, output, bi-directional), drive strength, output types, output skew, and input/output polarity.

Therefore, more generally, the control module 110 may transfer a set of configuration data for a second one of circuit elements after initiation of and concurrent with an operational state in a first of the circuit elements. The first circuit element may initiate operation upon receipt of corresponding configuration data. It is worth noting that the sequence of the transfer may be configurable via the control module 110. For example, the first transferred configuration data from the nonvolatile memory 105 may, in one embodiment, configure the control module 110 for a specific sequence or modify the sequence. The control module 110 may be programmed in a number of different ways to otherwise modify the sequencing.

The control module 110 may be implemented with one or more Application Specific Integrated Circuits (ASICs) adapted to perform some or all of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors.

As noted above, the volatile memory 115 may be in communication with the nonvolatile memory 105 and the control module 110. The volatile memory 115 may be configured to receive the configuration data from the nonvolatile memory 105 in the transfer sequence (either directly, or via the control module 110 or other interface) and store each transferred set of configuration data. The volatile memory 115 includes memory that does not retain stored information when not powered. Volatile memory 115 may include dynamic random access memory (DRAM), static random access memory (SRAM), content addressable memory, dual-ported random access memory, and other forms of random access memory. In one embodiment, the volatile memory 115 is a volatile registers bank. The volatile memory may be configured to be in communication with each of the circuit elements (e.g., the configurable circuit of a clock generator), and make each set of configuration data accessible for the programming of the circuit elements as it is stored. The control module 110 may signal when each respective set has been successfully transferred so that the relevant programming elements may access the information even as additional transfers are in progress.

Figure 2A:
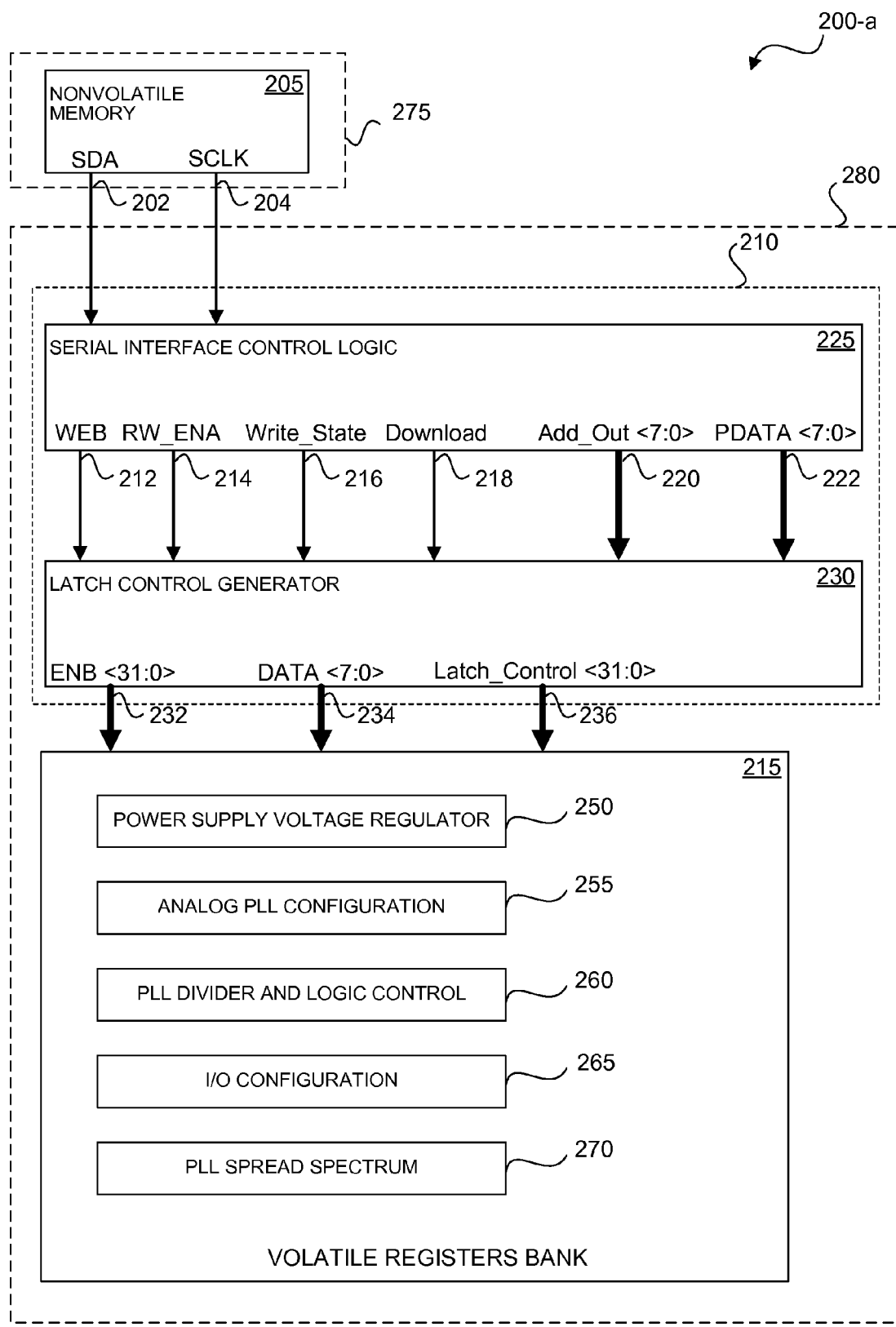
FIGS. 2A and 2B are block diagrams illustrating example circuit configuration architectures that sequence configuration data transfers according to various embodiments of the present invention.

Turning next to FIG. 2A, a block diagram is shown illustrating an example circuit configuration 200-*a* that provides for sequenced transfer of configuration data according to various embodiments of the present invention. A nonvolatile memory array 205 (which may be the nonvolatile memory 105 of FIG. 1) is in communication with a serial interface control logic block 210. In the illustrated embodiment, the nonvolatile memory array 205 resides on a first semiconductor substrate 275 and the serial interface control logic block 225 and remaining circuitry reside on a second semiconductor substrate 280. The first semiconductor substrate 275 and the second semiconductor substrate 280 may be, for example, on a common packaging substrate (not shown) such as a multi-chip module (MCM) or in separate packages and coupled through a circuit board. To provide for communication to the serial interface control logic block 225, the nonvolatile memory array 205 has a serial-data (SDA) terminal 202 and a serial-clock (SCLK) terminal 204. A two wire serial protocol, such as the inter-integrated circuit (I2C) bus protocol, for example, may be implemented using the serial-data terminal 202 and the serial-clock terminal 204. The I2C bus protocol is an industry standard and is suitable for purposes of downloading clock configuration data.

The serial interface control logic block 225 may be in communication with a latch control generator block 230. To interface to the latch control generator block 230, the serial interface control logic block 225 provides a write-enable-bar (WEB) terminal 212, a read-write-enable (RW_ENA) terminal 214, a write-state (Write_State) terminal 216, a download (Download) terminal 218, an address-out (Add_Out <7:0>) bus 220, and a program-data (PDATA <7:0>) bus 222. The address-out bus 220 and the program-data bus 222 may be, for example, eight bits wide. The serial interface control logic block 225 and latch control generator block 230 may, in combination, make up a control module 210 (e.g., the control module 110 of FIG. 1).

The latch control generator block 230 may be in communication with a volatile registers bank 215 through an enable-bar (ENB <31:0>) bus 232, a data (DATA <31:0>) bus 234, and a latch-control (Latch_Control <31:0>) bus 236. The enable-bar bus 232 and the latch-control bus 236 may be, for example, 32 bits wide; while the data bus 234 may be, for example, 8 bits wide.

The volatile registers bank 215 may be the volatile memory 115 of FIG. 1. Configuration data registers, for retaining circuit element configuration data, reside in the volatile registers bank 215. The volatile registers bank 215 contains a power supply voltage regulator register 250, an analog PLL configuration register 255, a PLL divider and logic control register 260, an I/O configuration register 265, and a PLL spread spectrum register 270. The enable-bar bus 232, the data bus 234, and the latch-control bus 236 may connect the above configuration registers of the volatile registers bank 215 to the latch control generator block 230.

At a system startup time, the serial interface control logic block 225 may commence operation by acquiring stored configuration data from the nonvolatile memory array 205. The serial interface control logic block 225 may produce signaling on the serial-data terminal 202 and the serial-clock terminal 204 (e.g., I2C protocol signaling) that specifies to the nonvolatile memory array 105 which sets of configuration data to provide and the proper sequence.

Additionally, the serial interface control logic block 225 may produce address data on the address-out bus 220 along with appropriate latch directive signaling on the write-enable-bar terminal 212, the read-write-enable terminal 214, the write-state terminal 216, and the download terminal 218 to instruct the latch control generator block 230 how to generate latch control signaling. The latch directive signaling from the serial interface control logic block 225 allows the latch control generator block 230 to produce signaling on the enable-bar bus 235 to enable latches of the configuration registers within the volatile registers bank 215 which correspond to the set configuration data coming from the nonvolatile memory array 205. As the configuration data from the nonvolatile memory array 205 is acquired by the serial interface control logic block 225, the data is provided at the program-data bus 222 to the latch control generator block 230. The latch control generator block 230 in turn, produces the configuration data at the data bus 234. The configuration data is provided to the appropriate configuration data register within the volatile registers bank 215 as the latch control generator block 230 produces control signaling on the latch-control bus 236 along with the appropriate signals, mentioned previously, on the enable-bar bus 232 and, for example, one byte width of configuration data at a time on the data bus 234. The preceding description is only one example configuration; a variety of other serial and parallel configurations may be used, as evident to those skilled in the art.

Figure 2B:
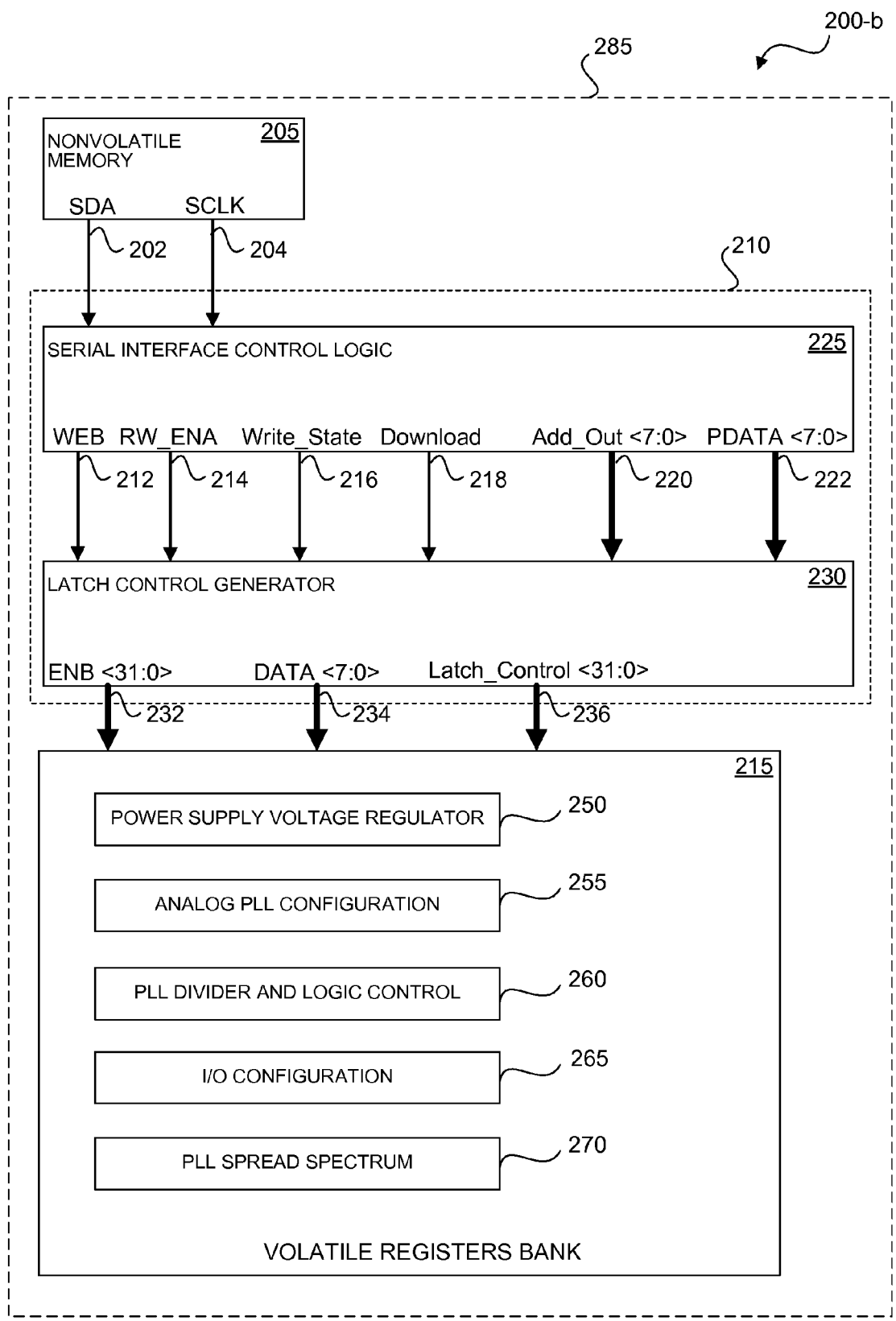

Turning next to FIG. 2B, a block diagram is shown illustrating an alternative example circuit configuration 200-b that provides for sequenced transfer of configuration data according to various embodiments of the present invention. In the illustrated embodiment, the nonvolatile memory array 205, control module components 210, and volatile register bank 215 reside on a single semiconductor substrate 285. In continuation, remaining circuit elements and their coupling to one another remain essentially as represented above in FIG. 1A. A number of other configurations may be used, as well.

With reference to Table 1, an example of how power-up time may be reduced in a further example embodiment of an optimized download sequence is illustrated. Using the illustrated sequence in a configurable clock circuit (e.g., the configuration circuit 200 of FIG. 2A or 2B), calculations indicate that the power-up time may be reduced by about, for example, four milliseconds (plus-or-minus 0.25 ms). The time savings is produced by loading configuration data for analog and digital portions of a PLL early in a download sequence and allowing the PLL to acquire lock while remaining configuration information is downloaded.

TABLE 1

| Frequency kHz | Period millisec | Number of Bytes | Data | Load Time millisec |
|---|---|---|---|---|
| 400 | 0.0025 | 8 | Power Supply | 0.16 |
| 400 | 0.0025 | 8 | Analog PLL | 0.16 |
| 400 | 0.0025 | 64 | Digital PLL | 1.28 |
| 400 | 0.0025 | 16 | IO Configuration | 0.32 |
| 400 | 0.0025 | 192 | Spread Spectrum PLL | 3.84 |

With reference to Table 1, the downloading of the Analog PLL and Digital PLL configuration can be sequenced prior to downloading the I/O Configuration and Spread Spectrum PLL configuration data. After all the configuration data for the Digital PLL portion (i.e., the second portion of the PLL) is received, the PLL lock acquisition phase may be initiated. This sequence allows the PLL to commence the process to acquire lock and the downloading of the I/O Configuration and Spread Spectrum PLL portions of configuration data may continue. The PLL may acquire lock while the remaining configuration data downloading sequence proceeds in parallel. By this sequencing, the clock circuit is able to acquire lock in the PLL portion of the circuit and continue downloading the configuration data to remaining portions of the configurable circuitry. This sequence may be produced instead of having to wait for the entire download sequence and each circuit element initiation process to conclude in serial fashion. In this way, the I/O Configuration load time (0.32 ms) and the Spread Spectrum PLL load time (3.84 ms) are accomplished during PLL lock acquisition time. The sum of these two download times is saved compared to a straight sequential download, since the two download times are accomplished during lock acquisition time. With consideration of having both processes concluded for stable operation of the clock circuit, the sum of the I/O Configuration load time and the Spread Spectrum PLL load time are saved in accomplishing a stable operation state for the clock circuit. From adding the I/O Configuration load time and the Spread Spectrum PLL load time, for example, over 4 ms are saved with nonvolatile download sequencing according to the preceding example.

Figure 3:
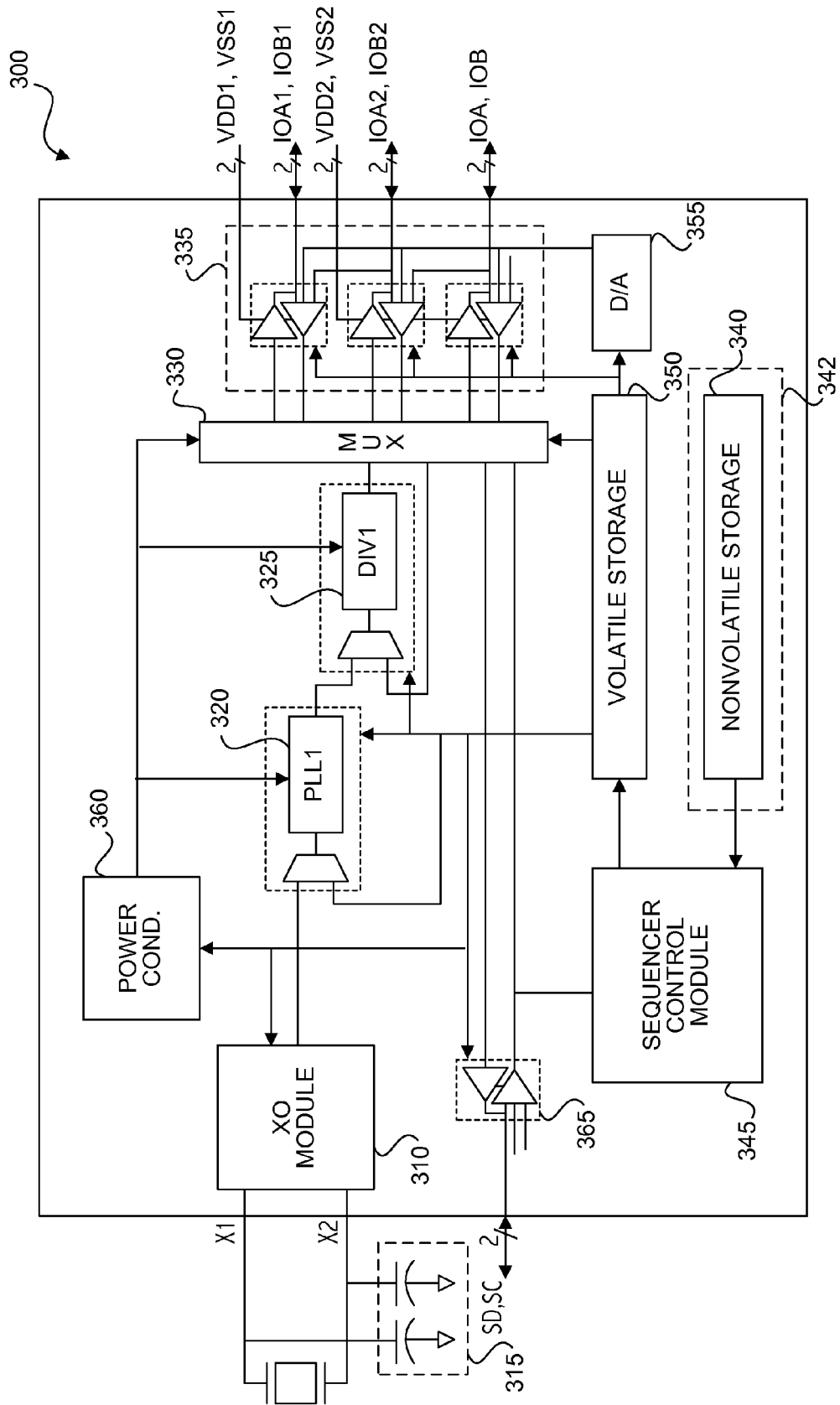
FIG. 3 is a block diagram illustrating an example clock generator architecture according to various embodiments of the present invention.

FIG. 3 illustrates a simplified block diagram of a clock generator 300 using programmable I/O buffers, according to various embodiments of the invention. The clock generator 300 include a crystal oscillator module 310. A pair of capacitors 315 connect crystal oscillator inputs X1, X2 to ground.

An output of the crystal oscillator module 310 is connected with an input multiplexer (mux) of a phase lock loop (PLL1) 320, providing a reference signal for the PLL. In other embodiments, additional PLLs may be used to allow for additional I/Os and further programmability. An output of the phase lock loop 320 is connected with an input multiplexer (mux) of a PLL divider (DIV1) 325. An output of the PLL divider 325 is fed to a MUX 330. A first set of outputs of the MUX 330 couples to programmable input/output buffers 335.

It will be further appreciated that embodiments of each instance of the programmable input/output buffers 335 (shown as a dashed box) implement two programmable I/O buffers. As shown, a first set of bi-directional (input/output) connections IOA1, IOB1 is powered by a first set of output buffer power supply terminals VDD1, VSS1; a second set of bi-directional (input/output) connections IOA2, IOB2 is powered by a second set of output buffer power supply terminals VDD2, VSS2; and a third set of bi-directional (input/output) connections IOA, IOB is powered by the second set of output buffer power supply terminals VDD2, VSS2. Terminals IOA, IOB, IOA1, IOB1, IOA2, and IOB2 provide interfaces to six programmable I/O buffers. In other embodiments, there may be more, or fewer programmable I/O buffers.

The clock generator 300 also includes nonvolatile storage array 340, which may be fabricated, for example, in a single monolithic semiconductor substrate or alternately, the nonvolatile storage array 340 may reside on a second semiconductor substrate 342. This may be the nonvolatile memory 105, 205 of FIG. 1, 2A, or 2B. The nonvolatile storage array 340 is in communication with a sequencer control module 345 (which may, for example, be the control module 110, 210 of FIG. 1, 2A, or 2B). The sequencer control module 345 is also connected with volatile storage array 350 (which may be the volatile memory 115, 215 of FIG. 1, 2A, or 2B).

The volatile storage array 350 is in communication with a digital-to-analog (d/a) block 355, a power conditioner block 360, a serial I/O block 365, the programmable input/output buffers 335, the mux 330, the PLL 320, the PLL divider 325, and the crystal oscillator module 310. The SIO block 365 couples to serial data and serial clock inputs SD,SC, the sequencer control module 345, and the mux 330. The power conditioner block 360 is coupled to PLL power inputs. The SIO block 365 may also be fabricated, for example, with instances of the programmable I/O buffer 100 of FIG. 1A, configured appropriately to requirements established by serial protocols, such as, for example, the inter-integrated circuit (I2C) bus.

Sets of configuration data (e.g., as shown in Table 1) may be maintained in the nonvolatile storage array 340 and made available to configure the programmable input/output buffers 335 at system power-up through the sequencer control module 345. The sequencer control module 345 may transfer sets of configuration data from the nonvolatile storage array 340 to the volatile storage array 350 in the following order (although other sequencing orders may be used in other embodiments), and operation of each circuit element may begin after the set of configuration data is received at the volatile storage array 350. In one embodiment, a set of configuration data for a power conditioner block 360 is transferred first. Operation of power conditioner block 360 is initiated upon completion of the transfer of the set of power conditioner block 360 configuration data, while remaining transfers continue. Next, a set of configuration data for a crystal oscillator module 310 is transferred after the power conditioner configuration data. Operation of the crystal oscillator module 310 is initiated upon completion of the transfer of the set of crystal oscillator module 310 configuration data, while remaining transfers continue.

Next, a set of configuration data for analog aspects of PLL 320 is transferred. Operation of PLL 320 analog elements may be initiated upon completion of the transfer of the analog PLL 320 configuration data, while remaining transfers continue. A set of configuration data for divide by logic in of PLL divider 325 is transferred after the analog PLL configuration data. Operation of PLL divider 325 may be initiated upon completion of the transfer of the digital PLL configuration data, while remaining transfers continue. Next, one or more sets of configuration data for programmable input/output buffers 335 is transferred. The operation of the programmable input/output buffers 335 is initiated upon completion of the transfer of the I/O configuration data (perhaps on a per I/O buffer basis, as respective sets of data are received), while the remaining transfer continues. A set of configuration data PLL spread spectrum may be transferred after the I/O configuration data. The preceding description is for purposes of example only, and other sequences in the same or other types of circuits may be used.

Figure 4:
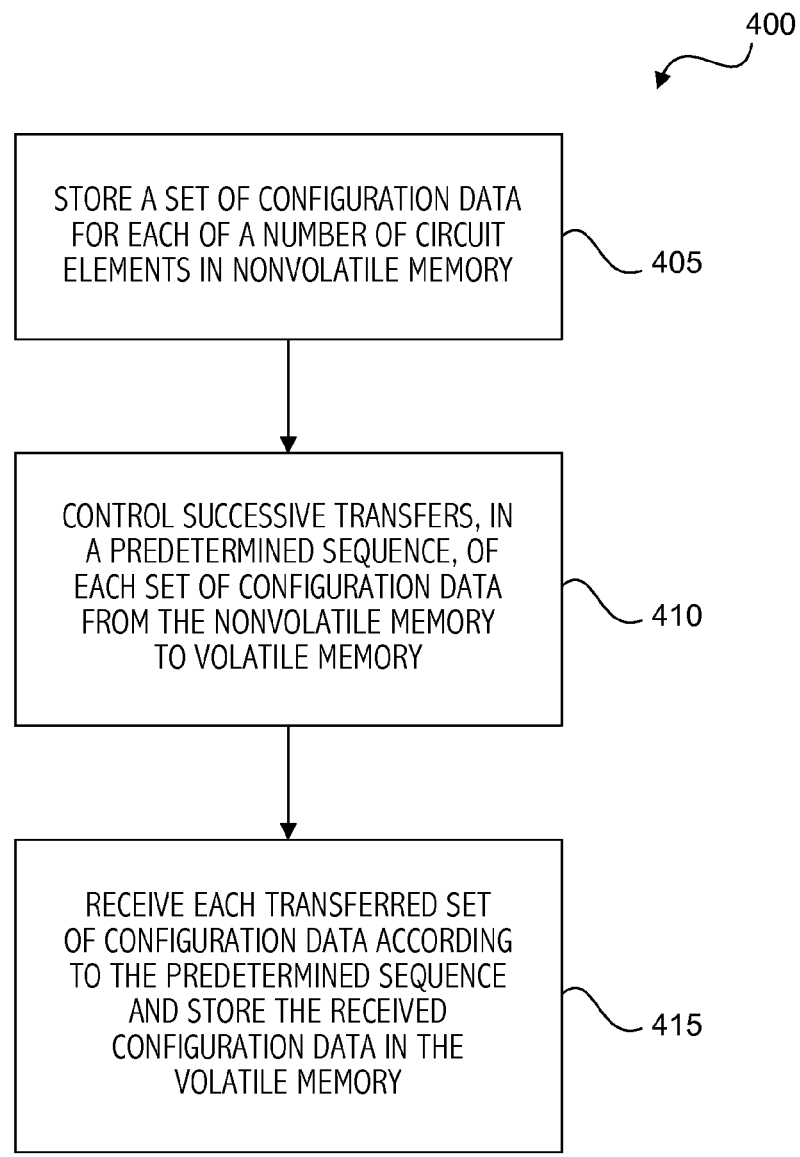
FIG. 4 is a flowchart illustrating a method for controlling the transfer of configuration data according to various embodiments of the invention.

FIG. 4 is a flowchart illustrating a method 400 for controlling the transfer of configuration data according to various embodiments of the invention. The method 400 may, for example, be performed in whole, or in part using the configuration of FIG. 1, the configuration circuit 200 of FIG. 2A or 2B, or the clock generator 300 of FIG. 3.

At block 405, a set of configuration data for each of a number of circuit elements is stored in nonvolatile memory. At block 410, a controlled transfer of each set of configuration data from the nonvolatile memory to volatile memory in a predetermined sequence is performed. At block 415, each transferred set of configuration data is received according to the predetermined sequence, and the received configuration data is stored in the volatile memory.

Figure 5:
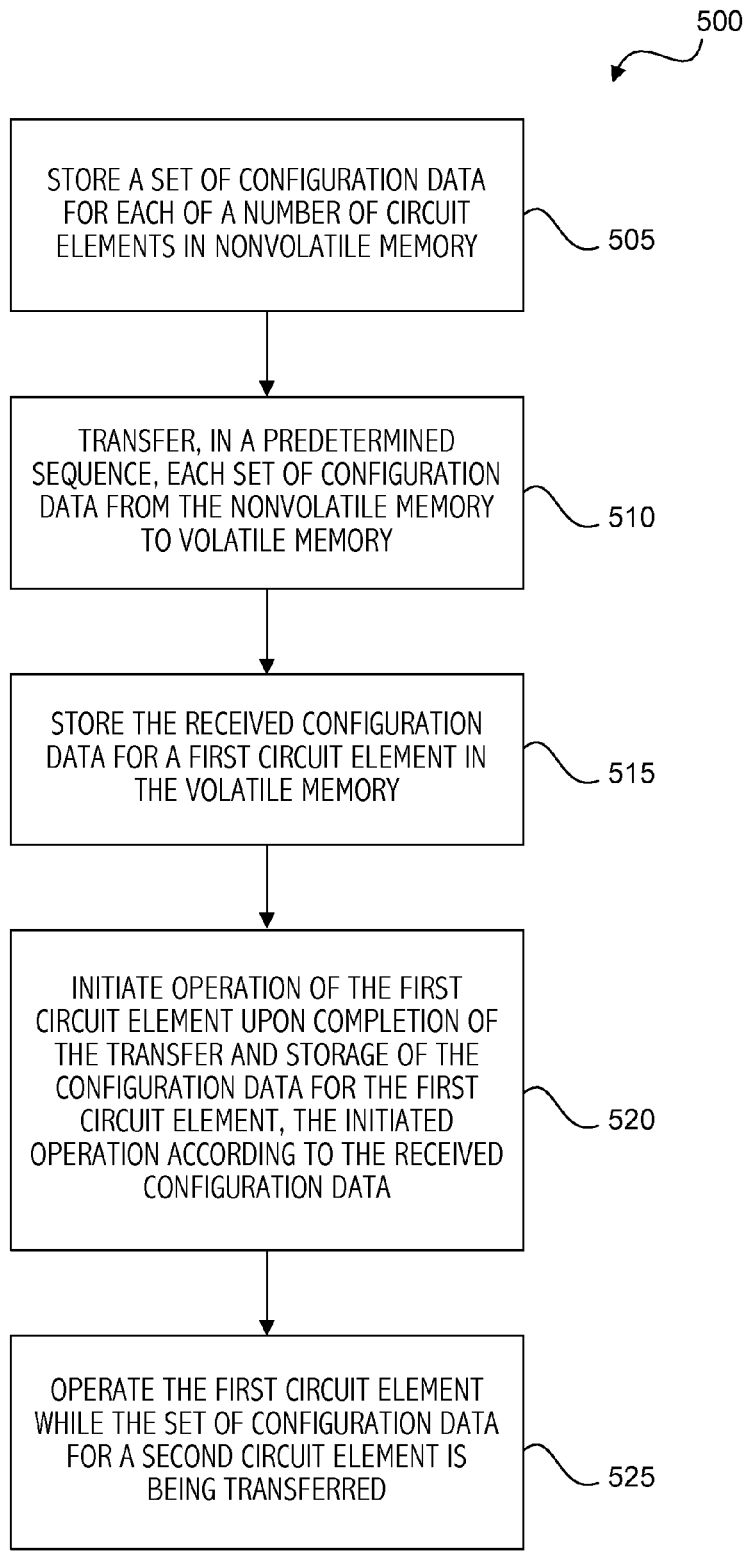
FIG. 5 is a flowchart illustrating a method for sequentially transferring configuration data according to various embodiments of the invention.

FIG. 5 is a flowchart illustrating a method 500 for sequentially transferring configuration data according to various embodiments, of the invention. The method 500 may, for example, be performed in whole or in part using the configuration of FIG. 1, the configuration circuit 200 of FIG. 2A or 2B, or the clock generator 300 of FIG. 3.

At block 505, a set of configuration data for each of a number of circuit elements is stored in nonvolatile memory. At block 510, each set of configuration data is transferred from the nonvolatile memory to volatile memory in a predetermined sequence. At block 515, the received configuration data for a first circuit element is stored in the volatile memory. At block 520, operation of the first circuit element is initiated upon completion of the transfer and storage of the configuration data for the first circuit element, the operation initiated according to the received configuration data. At block 525, the first circuit element is operated while the set of configuration data for a second circuit elements is being transferred. The first circuit element may, but need not, become operationally stable during the transfer of the set of configuration data for a second circuit element.

Figure 6:
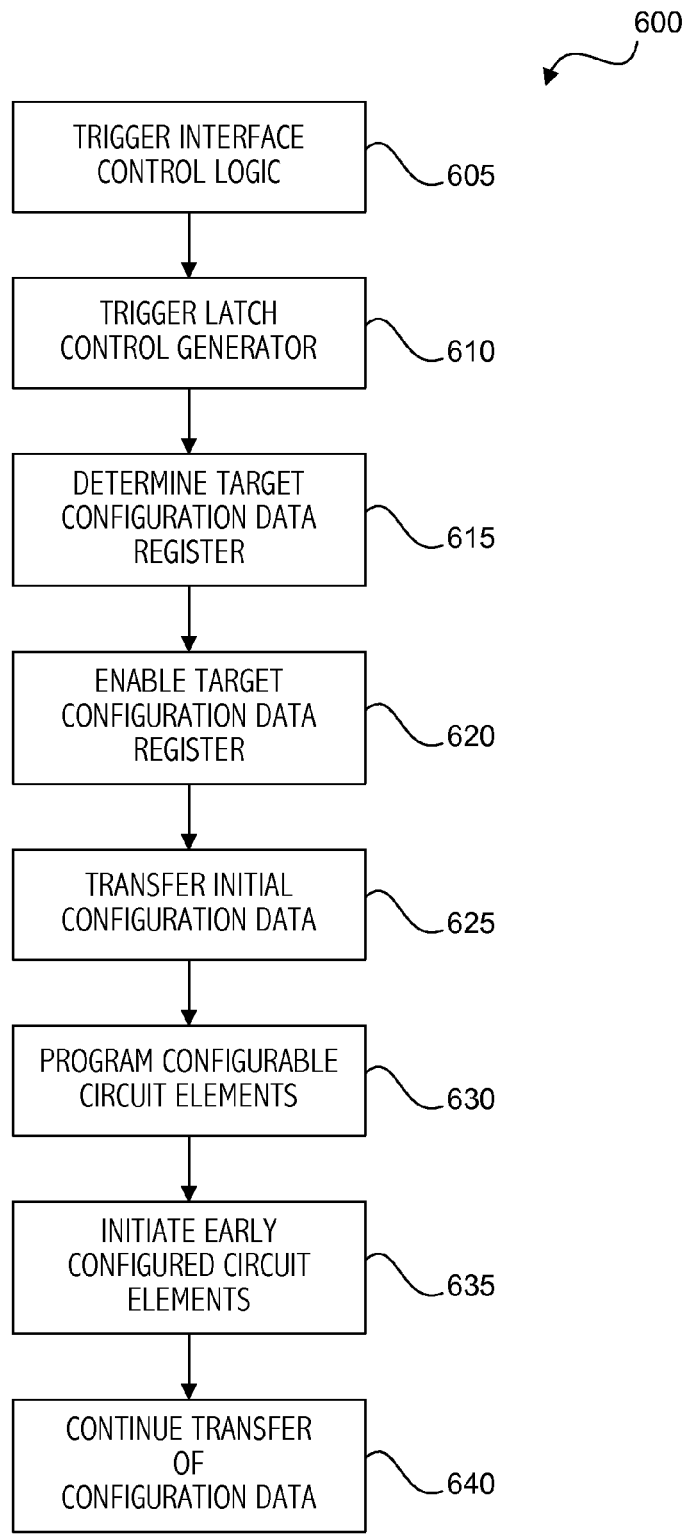
FIG. 6 is a flowchart illustrating a method for transferring configuration data from a nonvolatile memory array to a volatile registers bank at system startup for a clock generator according to various embodiments of the invention.

FIG. 6 is a flowchart illustrating a method 600 for transferring configuration data from a nonvolatile memory array to a volatile registers bank at system startup for a clock generator according to various embodiments of the invention. The method 600 may, for example, be performed in whole or in part using the configuration of FIG. 1, the configuration circuit 200 of FIG. 2A or 2B, or the clock generator 300 of FIG. 3.

At block 605, the interface control logic is triggered, for example, by power-on sequencer or control module. At block 610, a latch control generator is triggered according to signaling produced by serial interface control logic. At block 615, a target configuration data register is determined. At block 620, the target configuration data register is enabled. At block 625, the initial set of configuration data is transferred nonvolatile memory to volatile registers bank. At block 630, the configurable circuit elements are programmed with the transferred configuration data. At block 635, the early configured circuit elements are initiated, while, at block 640, the transfer of remaining configuration data is continued.

Figure 7:
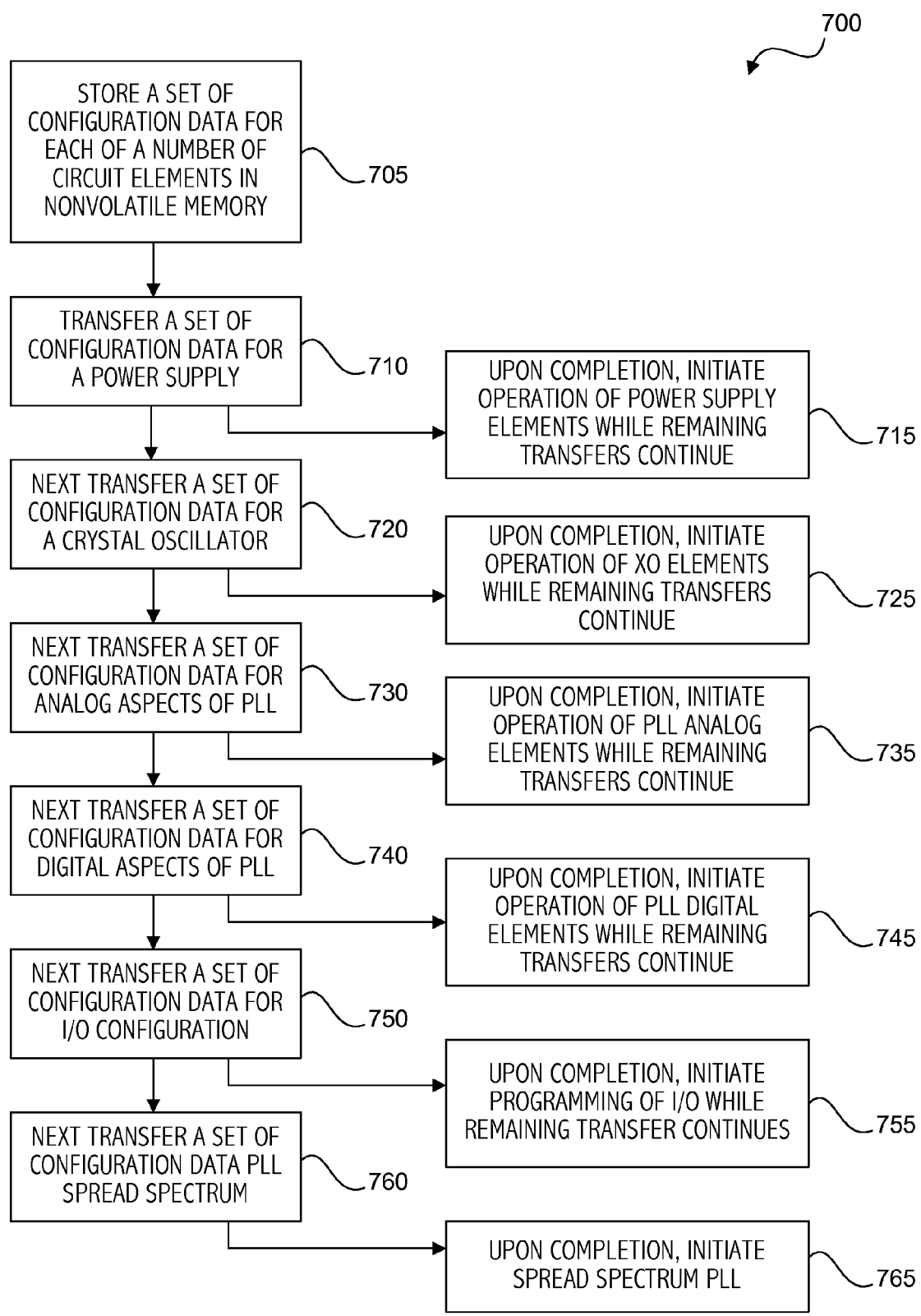
FIG. 7 is a flowchart illustrating a method 700 for transferring sets of configuration data in a predetermined sequence and initiating operation of circuits elements as the relevant configuration data is received, according to various embodiments of the invention.

FIG. 7 is a flowchart illustrating a method 700 for transferring sets of configuration data in a predetermined sequence and initiating operation of circuits elements as the relevant configuration data is received, according to various embodiments of the invention. The method 700 may, for example, be performed in whole or in part using the configuration of FIG. 1, the configuration circuit 200 of FIG. 2A or 2B, or the clock generator 300 of FIG. 3.

At block 705, a set of configuration data for each of a number of circuit elements is stored in nonvolatile memory. At block 710, a set of configuration data for a power supply is transferred. At block 715, operation of power supply elements is initiated upon completion of the transfer of the power supply configuration data, while remaining transfers continue. At block 720, a set of configuration data for a crystal oscillator is transferred after the power supply configuration data. At block 725, operation of crystal oscillator elements is initiated upon completion of the transfer of the crystal oscillator configuration data, while remaining transfers continue.

At block 730, a set of configuration data for analog aspects of a PLL is transferred after the crystal oscillator configuration data. At block 735, operation of PLL analog elements is initiated upon completion of the transfer of the analog PLL configuration data, while remaining transfers continue. At block 740, a set of configuration data for digital aspects of PLL is transferred after the analog PLL configuration data. At block 745, operation of PLL digital elements is initiated upon completion of the transfer of the digital PLL configuration data, while remaining transfers continue.

At block 750, a set of configuration data for I/O configuration is transferred after the digital PLL configuration data. At block 755, the programming of I/O buffers is initiated upon completion of the transfer of the I/O configuration data, while the remaining transfer continues. At block 760, a set of configuration data PLL spread spectrum is transferred after the I/O configuration data. At block 765, spread spectrum PLL operation is initiated upon completion of the transfer of the spread spectrum PLL configuration data.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices, or other computer-readable mediums for storing information. The term "computer-readable medium" includes, but is not limited to, portable or fixed storage devices, optical storage devices, wireless channels, a sim card, other smart cards, and various other mediums capable of storing, containing, or carrying instructions or data.

Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A configuration circuit for configuring circuit elements, the circuit comprising:
   a nonvolatile memory array configured to store a set of configuration data for each of a plurality of circuit elements;
   a control module, communicatively coupled with the nonvolatile memory array and a volatile memory, and configured to control successive transfers, in a predetermined sequence, of each set of configuration data to the volatile memory, wherein in controlling the successive transfers, the control module is configured to:
      control transfer of a first set of configuration data corresponding to a power supply; and
      control, after transfer of the first set of data, transfer of additional sets of the configuration data; and
   the volatile memory, configured to be communicatively coupled with each of the plurality of circuit elements, and configured to receive and store each transferred set of configuration data, wherein the power supply is adapted to begin operation after receipt of the first set of configuration data and during the transfer of one or more of the additional sets of the configuration data.

2. The configuration circuit of claim 1, wherein the control module, in controlling the successive transfers, is configured to commence the predetermined sequence with the first set of configuration data corresponding to the power supply.

3. The configuration circuit of claim 1, wherein one or more of the additional sets of the configuration data comprise a second set of configuration data corresponding to a system timing circuit.

4. The configuration circuit of claim 3, wherein the power supply is operational according to the first set of configuration data while the second set of configuration data is being transferred.

5. The configuration circuit of claim 3, wherein, the system timing circuit comprises a phase lock loop; and the plurality of circuit elements comprise a clock generator circuit.

6. The configuration circuit of claim 5, wherein the control module, in controlling transfer of the second set of configuration data, is configured to:
   commence by controlling transfer of analog phase lock loop configuration data; and
   initiate, after transfer of the analog phase lock loop configuration data is initiated, transfer of digital phase lock loop configuration data.

7. The configuration circuit of claim 3, wherein the control module, in controlling the successive transfers, is configured to:
   initiate, after transfer of the second set of configuration data comprising analog and digital phase lock loop configuration data, transfer of a third set of configuration data corresponding to a system input/output circuit.

8. The configuration circuit of claim 1, wherein the control module is further configured to control transfer of additional sets of the configuration data after initiation of and substantially concurrent with a stable operational state of the power supply, the power supply initiating operation upon receipt of corresponding configuration data.

9. The configuration circuit of claim 1, wherein the control module is configured to modify the predetermined sequence.

10. The configuration circuit of claim 1, wherein the control module comprises:
    an interface controller configured to acquire configuration data from the nonvolatile memory array; and
    a storage controller configured to transfer, in the predetermined sequence, the configuration data from the nonvolatile memory array to the volatile memory.

11. The configuration circuit of claim 10, wherein, the interface controller is further configured to produce control signaling to the storage controller;
    the storage controller is further configured to produce control signaling to the volatile memory;
    the volatile memory comprises a volatile register bank;
    the transfers are performed using a serial interface; and
    the interface controller and the storage controller are on the same monolithic semiconductor substrate.

12. A programmable clock generator comprising:
    a nonvolatile memory array configured to store a set of configuration data for each of a plurality of circuit elements of the programmable clock generator;
    a control module, communicatively coupled with the nonvolatile memory array and a volatile memory, and configured to control successive transfers, in a predetermined sequence, of each set of configuration data to the volatile memory;

the volatile memory configured to store each transferred set of configuration data; and the plurality of circuit elements, communicatively coupled with the volatile memory, wherein a first circuit element of the plurality of circuit elements is adapted to begin operation:

after storage of a first set of configuration data corresponding to the first circuit element at the volatile memory; and during transfer of one or more additional sets of the configuration data.

13. The programmable clock generator of claim 12, wherein the control module, in controlling the successive transfers, is configured to:

commence the predetermined sequence with the first set of configuration data, the first set of configuration data corresponding to a specified voltage level associated with a power supply of the programmable clock generator; and initiate, after completing transfer of the first set of configuration data corresponding to the specified voltage level associated with the power supply of the programmable clock generator, transfer of a first one of the additional sets of configuration data corresponding to specifications for a crystal oscillator.

14. The programmable clock generator of claim 13, wherein operation of the crystal oscillator is initiated according to the first one of the additional sets of configuration data while a second one of the additional sets of configuration data is being transferred corresponding to divide by logic for a phase lock loop.

15. The programmable clock generator of claim 12, wherein the control module, in controlling transfer of the sets of configuration data, is configured to control transfer of analog phase lock loop configuration data; and initiate, upon transfer of the analog phase lock loop configuration data, transfer of digital phase lock loop configuration data comprising divide by logic information.

16. The programmable clock generator of claim 12, wherein, the predetermined sequence is programmable;

the volatile memory comprises a volatile register bank; and the programmable clock generator is used for a printer, copier, liquid crystal display, portable computer, mobile phone, router, switch, storage device, high definition television, or other stand alone or embedded computing device.

17. A method comprising:

storing a set of configuration data for each of a plurality of circuit elements in nonvolatile memory;

transferring, in a predetermined sequence, each set of configuration data from the nonvolatile memory to a volatile memory;

storing each transferred set of configuration data in the volatile memory; and operating a first of the plurality of circuit elements while the set of configuration data for a second of the circuit elements is being transferred, wherein the transfer of the set of configuration data for the first circuit element occurs earlier in the predetermined sequence than the transfer of the set of configuration data for the second circuit element.

18. The method of claim 17, wherein the transferring step comprises:

commencing the predetermined sequence with transfer of the set of configuration data corresponding to the first circuit element, the first circuit element comprising a power supply.

19. The method of claim 18, further comprising:

initiating operation of the first circuit element substantially upon completion of the transfer of configuration data corresponding to the first circuit element.

20. The method of claim 19, further comprising:

initiating, substantially upon or after completion of the transfer of configuration data corresponding to the first circuit element, transfer of the set of configuration data corresponding to the second circuit element, the second circuit element comprising a system timing circuit.

21. The method of claim 20, wherein, the system timing circuit comprises a phase lock loop; and the plurality of circuit elements comprise a clock generator circuit.

22. The method of claim 17, wherein the transfer of the set of configuration data corresponding to the second circuit element comprises:

transferring analog phase lock loop configuration data; and initiating, substantially upon or after completion of the transfer of the analog phase lock loop configuration data, transfer of digital phase lock loop configuration data.

23. The method of claim 17, wherein the transferring step comprises:

initiating, substantially upon or after completing transfer of a set of configuration data comprising analog and digital phase lock loop configuration data, transfer of a set of configuration data corresponding to a system input/output circuit, wherein the analog and digital phase lock loop comprises the first circuit element and the system input/output circuit comprises the second circuit element.

24. The method of claim 17, wherein the transferring step comprises: completing transfer of the set of configuration data for the second circuit element before the first circuit element has reached a stable operating state.

25. The method of claim 17, wherein the first circuit element comprises an analog portion of a phase lock loop and the second circuit element comprises a divider portion of the phase lock loop.

* * * * *